United States Patent
Yu

(10) Patent No.: US 6,333,244 B1
(45) Date of Patent: Dec. 25, 2001

(54) CMOS FABRICATION PROCESS WITH DIFFERENTIAL RAPID THERMAL ANNEAL SCHEME

(75) Inventor: Bin Yu, Sunnyvale, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 09/491,422

(22) Filed: Jan. 26, 2000

(51) Int. Cl.$^7$ .................................................. H01L 29/72
(52) U.S. Cl. ........................ 438/528; 438/197; 438/211; 438/230; 438/231; 438/519; 438/530; 257/410
(58) Field of Search ............................ 257/410; 438/197, 438/211, 230, 231, 519, 528, 530

(56) References Cited

U.S. PATENT DOCUMENTS

| | | |
|---|---|---|
| 4,683,645 | 8/1987 | Naguib et al. . |
| 4,745,082 | 5/1988 | Kwok . |
| 4,784,718 | 11/1988 | Mitani et al. . |
| 5,017,504 | 5/1991 | Nishimura et al. . |
| 5,264,382 | 11/1993 | Watanabe . |
| 5,270,232 | 12/1993 | Kimura et al. . |
| 5,374,575 | 12/1994 | Kim et al. . |
| 5,391,510 | 2/1995 | Hsu et al. . |
| 5,393,685 | 2/1995 | Yoo et al. . |
| 5,429,956 | 7/1995 | Shell et al. . |
| 5,434,093 | 7/1995 | Chau et al. . |
| 5,538,913 | 7/1996 | Hong . |
| 5,576,227 | 11/1996 | Hsu . |
| 5,593,907 | 1/1997 | Anjum et al. . |
| 5,607,884 | 3/1997 | Byun . |
| 5,675,159 | 10/1997 | Oku et al. . |
| 5,716,861 | 2/1998 | Moslehi . |
| 5,736,435 | 4/1998 | Venkatesan et al. . |
| 5,793,090 | 8/1998 | Gardner et al. . |
| 5,801,075 | 9/1998 | Gardner et al. . |
| 5,811,323 | 9/1998 | Miyasaka et al. . |
| 5,814,544 | 9/1998 | Huang . |
| 5,817,558 | 10/1998 | Wu . |
| 5,824,586 | 10/1998 | Wollesen et al. . |
| 5,825,066 | 10/1998 | Buynoski . |
| 5,856,225 | 1/1999 | Lee et al. . |
| 5,858,843 | 1/1999 | Doyle et al. . |
| 5,904,530 | 5/1999 | Shin . |
| 5,915,180 | 6/1999 | Hara et al. . |
| 5,915,183 | 6/1999 | Gambino et al. . |
| 5,937,297 | 8/1999 | Peidous . |
| 5,953,602 | 9/1999 | Oh et al. . |
| 5,972,754 | 10/1999 | Ni et al. . |
| 5,998,288 | 12/1999 | Gardner et al. . |
| 5,998,828 | * 12/1999 | Ueno et al. ........................ 257/410 |

FOREIGN PATENT DOCUMENTS

| | | |
|---|---|---|
| 3-248433 | 11/1991 | (JP) . |
| 4-123439 | 4/1992 | (JP) . |
| 5-160396 | 6/1993 | (JP) . |

OTHER PUBLICATIONS

"Sub–100nm Gate Length Metal Gate NMOS Transistors Fabricated by a Replacement Gate Process" Chapman, et al. International Electronic Devices Meeting 1997. Jan.

* cited by examiner

Primary Examiner—Edward Wojciechowicz
(74) Attorney, Agent, or Firm—Foley & Lardner

(57) ABSTRACT

A method of fabricating an integrated circuit with ultra-shallow source/drain junctions utilizes a dual amorphization technique. The technique creates a shallow amorphous region and a deep amorphous region. The shallow amorphous region is between 10–15 nm below the top surface of the substrate, and the deep amorphous region is between 150–200 nm below the top surface of the substrate. The process can be utilized for P-channel or N-channel metal oxide semiconductor field effect transistors (MOSFETs). In the case of a P-channel MOSFET, a nitrogen barrier is formed in the P-channel gate prior to p+ doping. Annealing the gate conductor is done in a step separate from the source/drain region annealing step.

23 Claims, 4 Drawing Sheets

CMOS FABRICATION PROCESS WITH DIFFERENTIAL RAPID THERMAL ANNEAL SCHEME

CROSS REFERENCE TO RELATED APPLICATIONS

This patent application is related to U.S. Pat. No. 6,200,869 issued on Mar. 13, 2001, by Yu et al., entitled "A Method of Fabricating an Integrated Circuit with Ultra-Shallow Drain/Source Extensions", U.S. Pat. No. 5,985,726 issued on Nov. 16, 1999 by Yu, et al., entitled "A Damascene Process for Forming Ultra-Shallow Source/Drain Extensions in ULSI MOSFET", and U.S. application Ser. No. 09/187,172, by Yu, entitled "Recessed Channel Structure for Manufacturing Shallow Source/Drain Extensions" filed on Nov. 6, 1998 and all assigned to the assignee of the present invention. In addition, this patent application is related to U.S. application Ser. No. 09/384,121, by Yu, entitled "CMOS Transistors Fabricated in Optimized RTA Scheme", filed on an even date herewith and assigned to the assignee of the present invention.

FIELD OF THE INVENTION

The present invention relates to integrated circuits and to methods of manufacturing integrated circuits. More particularly, the present invention relates to a method of manufacturing integrated circuits having CMOS transistors with an optimized annealing scheme.

BACKGROUND OF THE INVENTION

Integrated circuits (ICs), such as, ultra-large scale integrated (ULSI) circuits, can include as many as one million transistors or more. The ULSI circuit can include complementary metal oxide semiconductor (CMOS) field effect transistors (FETs). The transistors can include semiconductor gates disposed between drain and source regions. The drain and source regions are typically heavily doped with a P-type dopant (boron) or an N-type dopant (phosphorous).

The drain and source regions generally include a thin extension that is disposed partially underneath the gate to enhance the transistor performance. Shallow source and drain extensions help to achieve immunity to short-channel effects which degrade transistor performance for both N-channel and P-channel transistors. Short-channel effects can cause threshold voltage roll-off and drain-induced barrier-lowering. Thus, controlling short channel effects is important to assuring proper semiconductor operation.

Conventional techniques utilize a double implant process to form shallow source and drain extensions. According to the conventional process, the source and drain extensions are formed by providing a transistor gate structure without sidewall spacers on a top surface of a silicon substrate. The silicon substrate is doped on both sides of the gate structure via a conventional doping process, such as, a diffusion process or ion implantation process. Without the sidewall spacers, the doping process introduces dopants into a thin region (i.e., just below the top surface of the substrate) to form the drain and source extensions as well as to partially form the drain and source regions.

After the drain and source extensions are formed, silicon dioxide spacers, which abut lateral sides of the gate structure, are provided over the source and drain extensions. The substrate is doped a second time to form the deeper source and drain regions. The source and drain extensions are not further doped due to the blocking capability of the silicon dioxide spacers.

As transistors disposed on integrated circuits (ICs) become smaller, transistors with shallow and ultra-shallow source/drain extensions have become more difficult to manufacture. Manufacturing is more difficult because the vertical dimensions associated with the depths of source/drain junctions and the thin extensions to the source/drain junctions must be decreased in a ratio corresponding to the reduction in lateral dimension of the manufactured MOSFET. For example, smaller transistors should have ultra-shallow source and drain extensions (less than 30 or 40 nanometer (nm) junction depth). Forming source and drain extensions with junction depths of less than 30 nm is very difficult using conventional fabrication techniques. Conventional ion implantation, diffusion doping and activation techniques make transistors on the IC susceptible to a dopant profile tail distribution that extends deep into the substrate. Also, conventional ion implantation techniques have difficulty maintaining shallow source and drain extensions because point defects generated in the bulk semiconductor substrate during ion implantation can cause the dopant to more easily diffuse (transient enhanced diffusion, TED). The diffusion often extends the source and drain extension vertically into the bulk semiconductor substrate.

As the critical dimensions for transistors are minimized, the total thermal budget (Bt) that the drain and source regions and the semiconductor gate experience becomes more critical. In general, the thermal budget for dopant activation in the source/drain junction (including source/drain extension) should be as low as possible to provide good formation of an ultra-shallow junction. Fundamentally, reducing the thermal budget has several advantages including: (1) more accurate formation of ultra-shallow junctions; (2) formation of ultra-tight dopant profiles, such as, profiles for halo implants or retro-graded channel implants; and (3) reduction of dopant penetration through the gate oxide and into the gate (e.g., Boron (B) in P-channel MOSFETs). Both shallow source and drain extensions and tight profile pocket regions help to improve the immunity of a transistor to short-channel effects.

Taking advantage of the results attainable via a lower thermal budget, conventional processes have reduced thermal budgets for CMOS transistor fabrication by utilizing a rapid thermal annealing (RTA) to heat the substrate. RTA does not require a significant period of time to heat the substrate. Another approach involves a spike RTA which increases the ramping rate of RTA. Nonetheless, the substrate must be exposed to the RTA for a time period of one second or more to appropriately diffuse and activate dopants.

According to conventional processes, the polysilicon gate and source and drain regions are implanted (doped) during the same fabrication step. After doping the gate and source and drain regions, the substrate is subject to a heating process which activates the dopant in both the gate and in source and drain regions. However, electrical activation of dopants in the gate requires a relatively high thermal budget (e.g., higher temperature than activation of dopants in the source and drain regions). The higher thermal budget increases the active dopant concentration in the gate which gives the transistor more drive current due to reduced gate-depletion effect. As described above, higher temperatures (higher thermal budgets) increase the susceptibility of the transistor to short channel effects. Because dopant activation in the source/drain junctions and dopant activation in the polysilicon gate have incompatible temperature requirements, optimizing the heating step for both the gate and for the source and drain regions is difficult.

Thus, there is a need for a method of manufacturing CMOS transistors that does not utilize a single RTA process for the gate and the source and drain regions. Further still, there is a need for transistors that are not as susceptible to gate depletion effect and short channel effects. Even further still, there is a need for an efficient method of manufacturing source and drain regions and polysilicon-based gate conductors.

SUMMARY OF THE INVENTION

An exemplary embodiment is related to a method of manufacturing an integrated circuit. The method includes providing a material disposed over a semiconductor substrate and implanting nitrogen into the material according to a gate pattern. The nitrogen implant forms a nitrogen barrier in the material above the semiconductor substrate. Next, the material is doped and a portion of the material is removed according to the gate pattern. After removal, a gate conductor, including a portion of the doped material and a portion of the nitrogen barrier, remains above the semiconductor substrate. Next, the gate conductor is annealed. After the gate conductor is annealed, the substrate is doped for source and drain regions and the substrate is annealed to form the source and drain regions.

Another embodiment is related to a method of manufacturing an integrated circuit including a plurality of field effect transistors having shallow source and drain extensions. The method includes steps of forming at least part of a p type gate structure on a top surface of a semiconductor substrate, and annealing the gate structure. The gate structure includes a nitrogen barrier above the semiconductor substrate. The method also includes providing a shallow amorphization implant, providing a deep amorphization implant, and annealing the substrate. The shallow amorphization implant creates a shallow amorphous region near the top surface. The deep amorphization implant creates a deep amorphous region in the substrate.

Yet another embodiment relates to a method of manufacturing an integrated circuit. The method includes forming at least a part of an n type gate conductor and at least a part of a p type gate conductor on a top surface of a substrate. The p type gate conductor includes a nitrogen barrier above the substrate. Next, the gate conductors are annealed in a high thermal budget process. After annealing the gate conductors, a shallow amorphization implant is provided, a deep amorphization implant is provided, and the substrate is annealed. The shallow amorphization implant creates a shallow amorphous region near the top surface. The deep amorphization implant creates a deep amorphous region in the substrate.

BRIEF DESCRIPTION OF THE DRAWINGS

The exemplary embodiments will hereafter be described with reference to the accompanying drawings, wherein like numerals denote like elements, and.

DETAILED DESCRIPTION OF THE PREFERRED EMBODIMENTS

Figure 1:
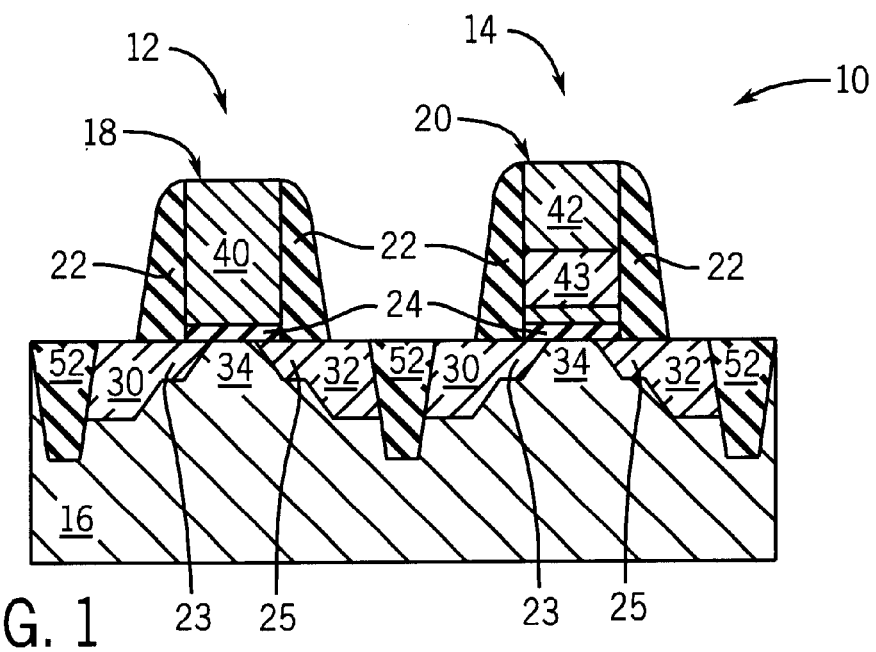
FIG. 1 is a cross-sectional view of a portion of an integrated circuit fabricated in accordance with an exemplary embodiment of the present invention.

With reference to FIG. 1, a portion 10 of an integrated circuit (IC) or chip includes a transistor 12 and a second transistor 14. Portion 10 is preferably part of an ultra-large-scale integrated (ULSI) circuit having 1,000,000 or more transistors. Portion 10 is manufactured as part of the IC on a semiconductor wafer, such as, a silicon wafer.

Transistors 12 and 14 are disposed on a substrate 16 that is preferably silicon. Transistor 12 includes a gate structure or stack 18, and transistor 14 includes a gate structure or stack 20. Each of gate stack 18 and gate stack 20 includes sidewall spacers 22, and a gate dielectric 24. In addition, gate stack 20 includes a barrier 43 which is preferably nitrogen ($N_{14}$). Spacers 22 and dielectric 24 can be silicon dioxide ($SiO_2$) or other insulating material. Spacers 22 are deposited as a silicon dioxide layer by chemical vapor deposition (CVD), which is selectively etched. Dielectric 24 is preferably thermally grown. Alternatively, spacers 22 can be a silicon nitride material or other insulative material.

Transistors 12 and 14 also both include a source region 30, a drain region 32, and a channel 34. Transistors 12 can be an N-channel transistor, and transistor 14 can be a P-channel transistor.

Source and drain regions 30 and 32 each include shallow source and drain extensions 23 and 25. Extensions 23 and 25 are preferably ultra-shallow extensions (e.g., junction depth less than 30–40 nanometers) which are thinner than the deepest portions of regions 30 and 32. Extensions 23 and 25 are connected to regions 30 and 32, respectively, and are disposed partially underneath gate dielectric 24. Ultra-shallow extensions 23 and 25 help transistors 12 and 14 achieve substantial immunity to short channel effects.

Gate stack 18 includes a gate conductor 40, and gate stack 20 includes a gate conductor 42. Gate conductors 40 and 42 are preferably manufactured from a semiconductor material, such as, polysilicon, or polysilicon doped or implanted with another semiconductor material, such as, germanium (Ge). Gate conductor 40 is heavily doped with an N-type dopant such as phosphorous (P), arsenic (As) or other dopant, and gate conductor 42 is heavily doped with a P-type dopant, such as, boron (B), boron diflouride ($BF_2$) or other dopants.

Transistors 12 and 14 can be any type of transistor. Most preferably, transistor 12 is a complementary N-channel MOSFET transistor and transistor 14 is a complementary P-channel MOSFET transistor. The transistors 12 and 14 can have threshold voltages from 0.2 V to 0.4V for N-channel and from −0.2 to −0.4 for P-channel, respectively. Gate conductors 40 and 42 both have significant dopant activation. Preferably, a high temperature, rapid thermal anneal (RTA) (e.g., 1050–1100° C.) is used for dopant activation, thereby achieving low resistance in the gate conductor as well as suppressing the gate poly-depletion effect. Achieving low resistance and suppressing the gate poly-depletion effect increases the drive current of transistors 12 and 14. Conductors 40 and 42 are preferably doped polysilicon and can include other semiconductor material, such as, germanium.

Source and drain regions 30 and 32 preferably have a deep junction depth of 600–800 Å, and extensions 23 and 25 preferably have a depth of 100–300 Å. The concentration of dopants in source and drain regions 30 and 32 is approximately $1\times10^{19}$–$5\times10^{19}$ dopants per cubic centimeter. Preferably, a low temperature, rapid thermal anneal (RTA) (e.g., 600–800 degrees C.) is used for dopant activation Advantageously, as will be described in the following detailed description, activation of gate dopants using a high-temperature RTA is accomplished prior to forming source and drain regions 30 and 32 and source/drain extensions 23 and 25. By completing gate dopant activation prior to source and drain formation, source and drain regions 30 and 32 as well as source/drain extensions 23 and 25 are not affected by the high-temperature (1050–1100° C.) RTA associated with gate dopant activation, but rather can be formed by a separate low-temperature RTA. By using a separate low-temperature RTA for activating dopants in drain and source regions 30 and 32 as well as extension 23 and 25, better short-channel performance in the transistor is achieved.

Transistors 12 and 14 are isolated from each other by insulative structures 52. Insulative structures 52 are preferably a silicon dioxide material fabricated according to a shallow transfer isolation (STI) process. Alternatively, a local oxidation of silicon (LOCOS) process can be utilized to form structures 52.

Gate dielectric 24 is preferably 20–50 Å thick. Gate structures or stacks 18 and 20 preferably have a total thickness (height) of 1200–1500 Å for CMOS technology generations with a gate line width of 100 nanometers or less. Spacers 22 are comprised of either oxides or nitrides at a width approximately 500–1000 Å.

With reference to FIGS. 1–7, the fabrication of portion 10, including transistors 12 and 14 is described below as follows. Portion 10 is fabricated in a differential RTA scheme which advantageously fully activates dopants in gate conductors 40 and 42 and yet does not adversely affect the formation of source and drain extensions 23 and 25.

Figure 2:
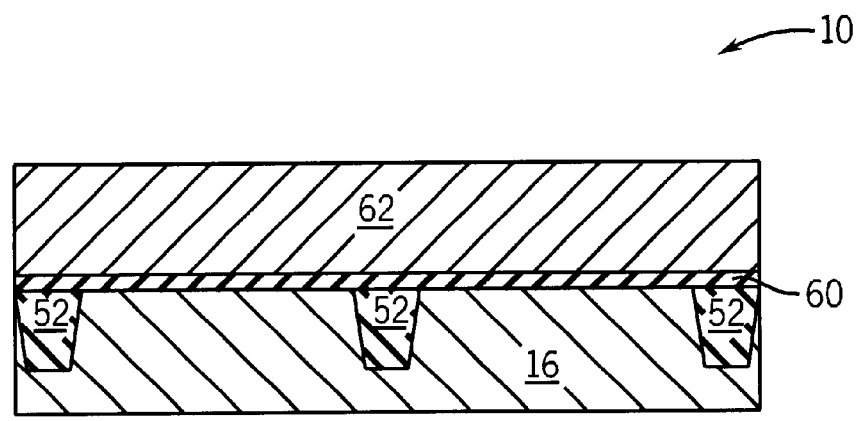
FIG. 2 is a cross-sectional view of a portion of the integrated circuit illustrated in FIG. 1, showing a polysilicon layer disposed over a substrate.

In FIG. 2, portion 10 includes substrate 16 beneath a gate oxide layer 60 that is beneath layer 62. Layer 62 can be a semiconductor layer or film, such as, a polysilicon layer, or a polysilicon/germanium layer. Layer 62 is approximately 1000–2000 Å thick. In addition, layer 62 is preferably undoped polysilicon formed by low pressure chemical vapor deposition (CVD). Layer 60 is thermally grown and approximately 20–50 Å thick. Layer 60 is an insulative layer preferably comprised of silicon dioxide ($SiO_2$). Alternatively, layer 60 can be deposited by CVD.

Figure 3:
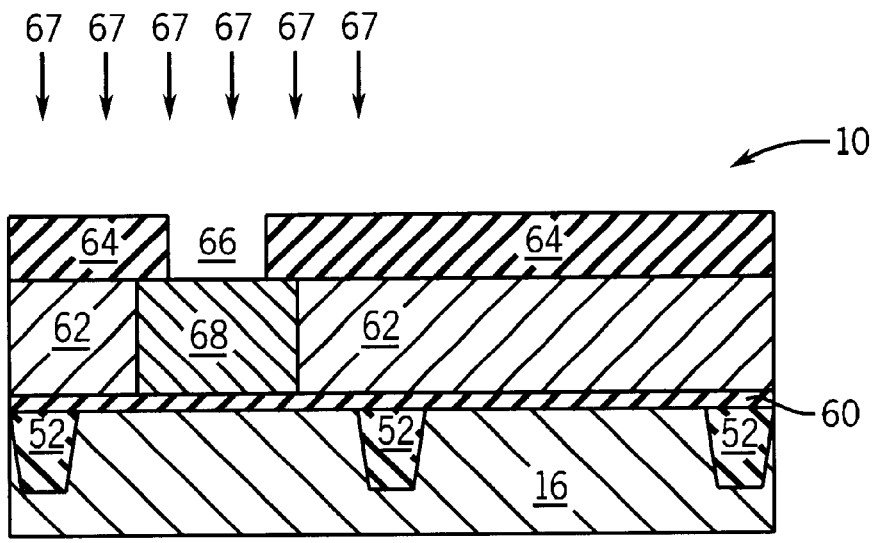
FIG. 3 is a cross-sectional view of the portion of the integrated circuit illustrated in FIG. 1, showing an N type doping step.

In FIG. 3, layer 62 is substantially covered by a photoresist layer 64. Layer 64 is selectively etched to form a window or an aperture 66 between structures 52. Preferably, aperture 66 is larger than the actual (final) gate dimension (width) to provide sufficient overlay margin. After aperture 66 is formed, substrate 16 is subjected to a $N^+$ dopant 67 implant. The $N^+$ dopant 67 implant forms an $N^+$ doped region 68 in layer 62. The $N^+$ dopant 67 can be $P^+$ (phosphorous), $As^+$ or other type dopant. After subjecting substrate 16 to the $N^+$ dopant 67 implant, photoresist layer 64 is stripped.

Figure 4:
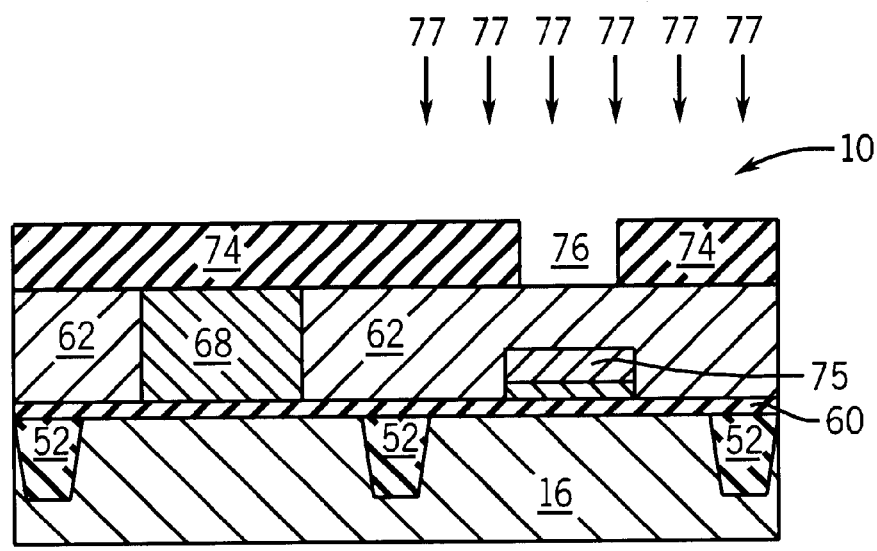
FIG. 4 is a cross-sectional view of the portion of the integrated circuit illustrated in FIG. 1, showing a nitrogen implant step.

In FIG. 4, layer 62 is substantially covered by a photoresist layer 74. Layer 74 is selectively etched to form a window or an aperture 76 between structures 52. Preferably, aperture 76 is larger than the actual (final) gate dimension (width) to provide sufficient overlay margin. After aperture 76 is formed, layer 62 is subjected to a barrier material 77 implant. Preferably, the barrier material 77 is nitrogen ($N_{14}$). The barrier material 77 implant forms a barrier layer 75 in layer 62 according to aperture 76. The barrier layer 75 serves to suppress gate dopant (FIG. 5, element 79) diffusion through the thin gate dielectric 60. Gate dopant 79 is preferably boron. As boron penetration effect causes severe degradation of transistor performance, the barrier layer 75 advantageously allows for increased transistor performance. Barrier layer 75 is about 200 Å thick or 10–20% of the total thickness of layer 62. Layer 75 begins 100 Å above layer 60 and ends 700–1700 Å below layer 74.

A similar barrier layer is not formed in the n+ type gate of n-channel MOSFET. The lack of a barrier layer 75 in the n+ type gate helps to suppress the gate poly-depletion effect in n-channel MOSFET (FIG. 1, element 12). Therefore the current drive of n-channel MOSFETs is not degraded.

Figure 5:
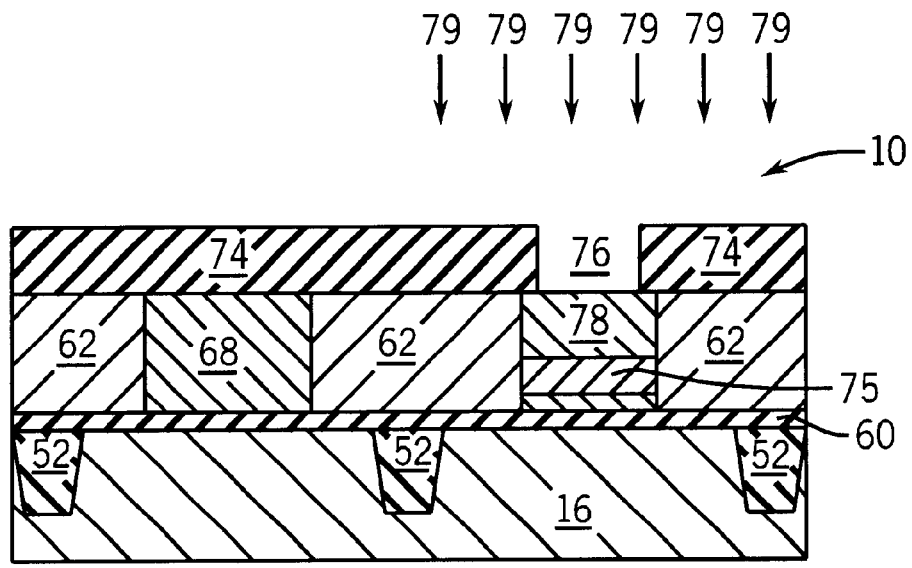
FIG. 5 is a cross-sectional view of the portion of the integrated circuit illustrated in FIG. 1, showing a P type doping step.
Figure 6:
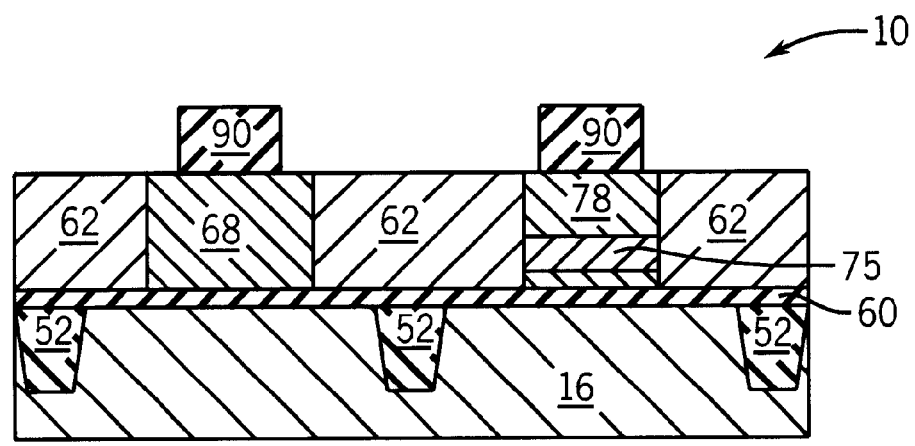
FIG. 6 is a cross-sectional view of the portion of the integrated circuit illustrated in FIG. 1, showing a photo resist formation step.

Referring now to FIG. 5, after barrier layer 75 is formed, substrate 16 is subjected to a $P^+$ dopant 79 implant. The $P^+$ dopant 79 implant forms a $P^+$ doped region 78 in layer 62. The $P^+$ dopant can be $B^+$ (Boron), $BF_2^+$, or other type dopant. After subjecting substrate 16 to the $P^+$ dopant implant, photoresist layer 74 is stripped. After the $P^+$ dopant implant, layer 74 is stripped, a photoresist layer 90 is provided over regions 68 and 78 as shown in FIG. 6. Region 78 is 700–1700 Å thick.

Figure 7:
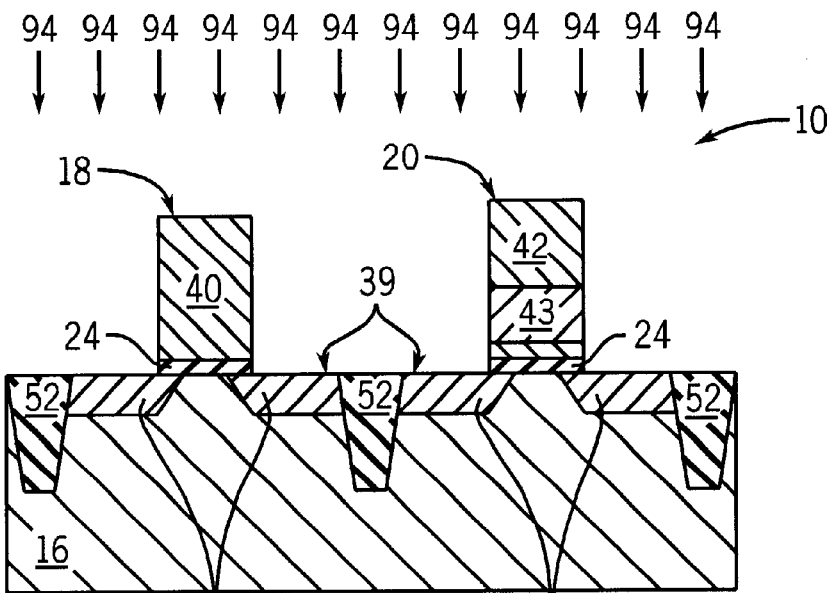
FIG. 7 is a cross-sectional view of the portion of the integrated circuit illustrated in FIG. 1, showing a shallow amorphization implant step.

Referring now to FIG. 6, preferably, a photoresist layer 90 is provided over layer 62. Preferably, layer 90 is patterned by E-beam lithography to define stacks 18 and 20 (FIG. 7). After patterning, stacks 18 and 20 are formed by etching. Preferably, an anisotropic dry etch is used to form stacks 18 and 20. The dry etching process removes portions of layers 68, layer 78, barrier 75, layer 62 and layer 60 to leave stacks 18 and 20.

Referring now to FIG. 7, layer 90 is stripped from stacks 18 and 20. After layer 90 is stripped, a high temperature, rapid thermal anneal (RTA) at 1050–1100° C. for a period of 5 to 10 seconds is utilized to activate dopants in regions 40 and 42.

In FIG. 7, after RTA to activate dopants in regions 40 and 42 is completed, portion 10 and substrate 16 are subjected to a shallow pre-amorphization implant (PAI) to form implant regions 92. Implant regions 92 are preferably amorphous silicon regions provided between 10–15 nm below top surface 39 of substrate 16. Regions 92 can be created by subjecting substrate 16 to an ion implantation technique. The ion implantation technique can charge semiconductor ions 94, such as, silicon ($Si^+$) or germanium ($Ge^+$) ions, to approximately 10–100 kiloelectron volts (keVs) (preferably $Ge^+$ at 5–20 keV at a dose of $2$–$4\times10^{14}$ dopants per square centimeter) and implant them into substrate 16. Ion implantation can be performed by implantation devices manufactured by companies, such as, Varian Company of Palo Alta, California, Genius Company, and Applied Materials, Inc. The silicon and germanium ions change the single crystal silicon associated with substrate 16 into amorphous silicon at region 92. The amorphous silicon associated with region 92 is represented by a stippled area in the figures. Regions 92 correspond to extensions 23 and 25 (FIG. 1).

Substrate 16 is subjected to a dopant implant under separate photolithographic masks for the P-channel and N-channel transistors. The dopant implant can be arsenic (As), boron difluoride ($BF_2$), indium (In), phosphorous (P), or any appropriate dopant for semiconductor fabrication operations. The dopant implant is performed at a dose of $10^{13}$ dopants per $cm^2$.

Figure 8:
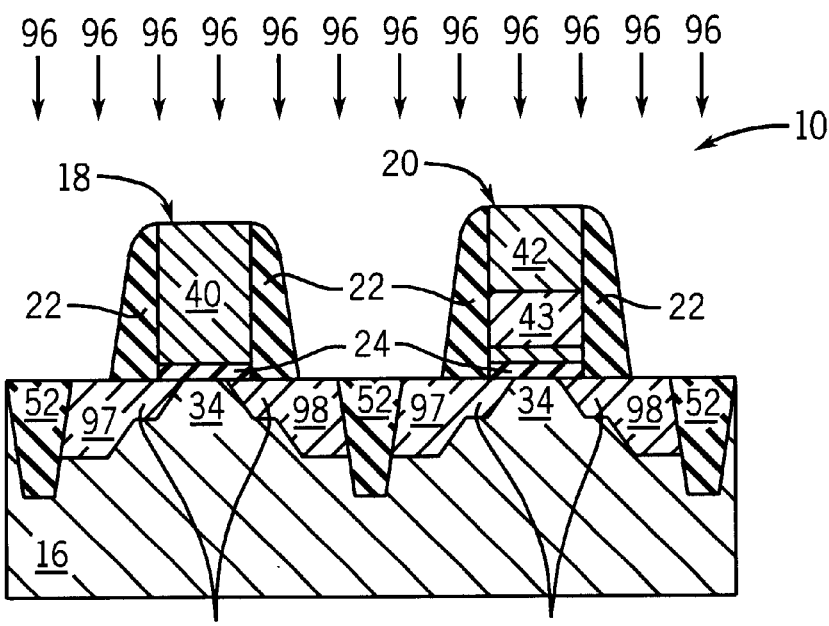
FIG. 8 is a cross-sectional view of the portion of the integrated circuit illustrated in FIG. 1, showing a deep amorphization implant step.

In FIG. 8, spacers 22 are formed according to a conventional deposition and etch back technique. After spacers 22 are formed, substrate 16 is subjected to a deep post-amorphization implant to form implant regions 97 and 98. Spacers 22 are 400–700 Å thick and 1000–2000 Å in height. Spacers 22 can be silicon dioxide.

Implant regions 97 and 98 are preferably amorphous silicon at a depth of approximately 60–80 nm. Regions 97 and 98 are formed by subjecting substrate 16 to an ion implantation technique, wherein silicon or germanium atoms 96 are implanted to a depth between 60–80 nm (Ge$^+$ at 50–90 keV at a dose of 4–6×10$^{14}$ dopants per squared centimeter). Regions 97 and 98 are represented as a stippled area in the FIG. 8. The implantation technique for forming regions 97 and 98 is similar to the technique for forming regions 92, except that the ions used to form regions 97 and 98 have more energy.

After regions 97 and 98 are formed, substrate 16 is subjected to a dopant implant under separate masks (one for N-channel and one for P-channel transistors). The dopant implant is similar to the dopant implant discussed with reference to FIG. 3 and FIG. 5 and performed at a dose of 5×10$^{14}$ to 1×10$^{15}$ dopant per square centimeters. After the dopant implant, a low-temperature RTA (550–650° C., for 5–20 minutes) is utilized to recrystallize amorphous regions 92, 97 and 98. Dopants within regions 92, 97 and 98 become electrically activated during the crystal regrowth process. In FIG. 1, source and drain regions 30 and 32 including extensions 23 and 25 are thus formed under a low thermal budget. The dopant profiles associated with regions 30 and 32 are relatively close to the implanted profiles.

It is understood that, while preferred embodiments, examples, materials, and values are given, they are for the purpose of illustration only. The apparatus and method of the invention are not limited to the precise details and conditions disclosed. For example, although a source/drain ion amorphization technique is disclosed, other methods could utilize the principles of the present invention to create ultra-shallow source and drain extensions. Thus, changes may be made to the details disclosed without departing from the scope of the invention, which is defined by the following claims.

What is claimed is:

1. A method of providing field effect transistors, the method comprising:
   providing a gate material over a semiconductor substrate;
   providing a first mask pattern having first apertures associated with N-type dopant gate conductors;
   providing N-type dopants through the first apertures;
   providing a second mask pattern having second apertures associated with P-type gate conductors;
   providing nitrogen type dopants through the second apertures to form a nitrogen barrier in the material above the semiconductor substrate;
   providing P-type dopants through the second apertures to the material;
   providing a third mask over the material, the third mask having features above the locations associated with the first apertures and the second apertures;
   removing the portions of the material in accordance with the features, whereby N-type gate conductors and P-type gate conductors are formed;
   annealing the N-type gate conductors and the P-type gate conductors;
   doping the substrate for source and drain regions; and
   annealing the substrate to form the source and drain regions.

2. The method of claim 1, wherein the material includes polysilicon disposed over a gate oxide.

3. The method of claim 1, wherein the second doping step forms a P+ region in the material.

4. The method of claim 3, wherein the gate annealing step is performed at a temperature of more than 1050 degrees C. and the substrate annealing step is performed at a temperature of less than 800 degrees C.

5. The method of claim 4, wherein the annealing steps are performed by rapidly heating.

6. The method of claim 4, wherein the transistors include source and drain extension, the extensions being less than 30 nm deep.

7. A method of providing field effect transistors, the method comprising the steps of:
   providing a layer of undoped polysilicon over a substrate;
   providing a first mask pattern above the layer, the first mask pattern having first apertures associated with N-type dopant gate conductors;
   providing N-type dopants through the first apertures to the layer;
   providing a second mask pattern above the layer, the second mask pattern having second apertures associated with P-type gate conductors;
   providing nitrogen type dopants through the second apertures to form a nitrogen barrier in the layer above the semiconductor substrate;
   providing P-type dopants through the second apertures to the layer;
   providing a third mask over the layer, the third mask having features above locations associated with the first apertures and the second apertures;
   removing portions of the layer in accordance with the features, whereby the N-type gate conductors and the P-type gate conductors are formed;
   annealing the N-type gate conductors or the P-type gate conductors;
   doping the substrate for source and drain regions; and
   annealing the substrate to form the source and drain regions.

8. The method of claim 1, wherein the layer is disposed over a gate oxide above the substrate.

9. The method of claim 1, wherein the providing P-type dopant step forms a P+ region in the layer.

10. The method of claim 3, wherein the gate annealing step is performed at a temperature of more than 1050 degrees C. and the substrate annealing step is performed at a temperature of less than 800 degrees C.

11. The method of claim 4, wherein the annealing steps are performed by rapidly heating.

12. The method of claim 4, wherein the transistors include source and drain extension, the extensions being less than 30 nm deep.

13. A method of providing field effect transistors, the method comprising:
   providing a gate material over a semiconductor substrate;
   providing a first mask pattern having first apertures associated with N-type dopant gate conductors;
   implanting N-type dopants through the first apertures;
   providing a second mask pattern having second apertures associated with P-type gate conductors;
   implanting nitrogen through the second apertures to form a nitrogen barrier in the material above the semiconductor substrate;
   implanting P-type dopants through the second apertures;
   providing a third mask over the material, the third mask having features above the locations of the first apertures and the second apertures;

removing portions of the material in accordance with the features, whereby the N-type gate conductors and the P-type gate conductors are formed; and annealing the gate conductors.

14. The method of claim 13, further comprising:

doping the substrate for source and drain regions; and annealing the substrate to form the source and drain regions.

15. The method of claim 13, wherein the third implanting step forms a P+ region in the material.

16. The method of claim 14, wherein the gate annealing step is performed at a temperature of more than 1050 degrees C. and the substrate annealing step is performed at a temperature of less than 800 degrees C.

17. The method of claim 16, wherein the annealing steps are performed by rapidly heating.

18. The method of claim 16, wherein the transistors include source and drain extension, the extensions being less than 30 nm deep.

19. A method of providing a field effect transistors, the method comprising:

providing a gate material over a semiconductor substrate;

providing a first mask pattern having first apertures associated with N-type dopant gate conductors providing N-type dopants through the first apertures;

providing a second mask pattern having second apertures associated with P-type gate conductors;

providing nitrogen type dopants through the second apertures to form a nitrogen barrier in the material above the semiconductor substrate;

providing P-type dopants through the second apertures;

prividing a third mask over the material, the third mask having features above the locations of the first apertures and the second apertures;

removing portions of the material in accordance with the features; whereby the N-type gate conductors and the P-type gate conductors are formed;

annealing the N-type and the P-type gate conductors;

amorphizing the substrate for source and drain extensions in the substrate;

doping the substrate for source and drain extensions;

providing spacers for the N-type and the P-type gate conductors;

amorphizing the substrate for deep source and drain regions in the substrate;

doping the substrate for the deep source and drain regions; and annealing the substrate.

20. The method of claim 19, wherein the material includes polysilicon disposed over a gate oxide.

21. The method of claim 19, wherein the second doping step forms a P+ region in the material.

22. The method of claim 19, wherein the gate annealing step is performed at a temperature of more than 1050 degrees C. and the substrate annealing step is performed at a temperature of less than 800 degrees C.

23. The method of claim 19, wherein the annealing steps are performed by rapidly heating.

* * * * *